US006765159B1

(12) United States Patent
Uebelein et al.

(10) Patent No.: US 6,765,159 B1
(45) Date of Patent: Jul. 20, 2004

(54) SWITCH TO BE MOUNTED ON A DESIGN ELEMENT IN THE PASSENGER COMPARTMENT OF A MOTOR VEHICLE

(75) Inventors: Joerg Uebelein, Grub am Forst (DE); Carsten Abert, Hassfurt (DE); Bernd Rexhaeuser, Steinach (DE)

(73) Assignee: Brose Fahrzeugteile GmbH &Co., Coburg (DE)

( * ) Notice: Subject to any disclaimer, the term of this patent is extended or adjusted under 35 U.S.C. 154(b) by 0 days.

(21) Appl. No.: 10/069,201

(22) PCT Filed: Aug. 18, 2000

(86) PCT No.: PCT/DE00/02863

§ 371 (c)(1),
(2), (4) Date: Feb. 22, 2002

(87) PCT Pub. No.: WO01/15186

PCT Pub. Date: Mar. 1, 2001

(30) Foreign Application Priority Data

Aug. 24, 1999 (DE) ........................................ 199 40 172

(51) Int. Cl.[7] ........................... H01H 1/40; H01H 1/58; B60R 16/02; H05K 1/16

(52) U.S. Cl. ..................... 200/17 R; 174/250; 174/260; 200/61.58 R; 200/292; 200/339; 361/749; 361/776; 361/781; 361/826; 361/828; 439/78; 439/571

(58) Field of Search ................................ 200/1 R, 1 A, 200/1 B, 5 R, 5 A, 6 A, 17 R, 51 R–51.17, 52–61.58 R, 61.62, 520, 553–563, 564–572, 292, 339, 1–18, 534, 314; 174/250–268; 361/679–832; 439/76–79, 571; 307/10.1

(56) References Cited

U.S. PATENT DOCUMENTS 4,045,650 A * 8/1977 Nestor ........................ 200/556
4,641,004 A * 2/1987 Keprda ....................... 200/534
4,997,996 A * 3/1991 Ohashi ....................... 174/260
5,045,656 A * 9/1991 Kojima ....................... 200/314
5,353,190 A * 10/1994 Nakayama et al. ..... 361/785 X
5,478,244 A * 12/1995 Maue et al. ............ 361/752 X
5,655,927 A * 8/1997 Maue et al. ................ 439/510
5,805,402 A * 9/1998 Maue et al. ........... 307/10.1 X

FOREIGN PATENT DOCUMENTS

| | | |
|---|---|---|
| DE | 700 2218 | 5/1970 |
| DE | 24 41 469 | 3/1976 |
| DE | 36 18 541 | 12/1987 |
| DE | 36 18 541 A1 | 12/1987 |
| DE | 43 13 030 | 10/1993 |
| DE | 43 13 030 A1 | 10/1993 |
| DE | 295 17 316 | 2/1996 |
| DE | 197 38 656 | 3/1999 |
| EP | 0 144 916 | 6/1985 |
| EP | 0 406 496 | 1/1991 |
| EP | 0 478 218 | 4/1992 |
| EP | 0 570 870 | 11/1993 |
| FR | 1 342 806 | 2/1964 |
| GB | 106 03 05 | 3/1967 |

OTHER PUBLICATIONS

U.S. patent application No. 09/486,862 as filed.
International Search Report for PCT/DE00/02863.
International Preliminary Examination Report for PCT/DE00/02863.

* cited by examiner

*Primary Examiner*—James R. Scott
(74) *Attorney, Agent, or Firm*—Christie, Parker & Hale, LLP

(57) ABSTRACT

A switch to be mounted on a design element in the passenger room of a motor vehicle includes a haptic element that functions as a mechanical operater and a visual element. Electrical and/or electronic switch elements are mounted on a flexible conductor element and optionally further electrical and electronic components. A zone of the flexible conductor element which carries the switch elements and an allocated zone of the haptic element are configured such that the corresponding zones can be positioned and fixated in relation to one another and do not establish a permanent electrical connection.

27 Claims, 5 Drawing Sheets

SWITCH TO BE MOUNTED ON A DESIGN ELEMENT IN THE PASSENGER COMPARTMENT OF A MOTOR VEHICLE

CROSS REFERENCE TO RELATED APPLICATION

This application claims priority of International application number PCT/DE00/02863, filed Aug. 18, 2000, which in turn claims priority of German application number 199 40 172.1, filed Aug. 24, 1999.

FIELD OF THE INVENTION

The invention relates to a switch to be mounted on a design element in the passenger compartment of a motor vehicle. The switch according to the invention is characterized by a simple secure assembly process as well as by its significant lack of dependence on the design of the haptic element.

By haptic element it is meant, a structural group of the switch which contains the mechanical operating elements required for manually operating the switch. The haptic element can furthermore serve as a visual element, e.g. by suitably configuring the haptic element it is possible to make the function of the switch visible to the user.

BACKGROUND OF THE INVENTION

From DE 197 38 656 A1 a switch is known whose electrical or electronic switch elements and whose associated operating elements in the haptic element are positioned independently of each other on various parts of the vehicle door. The switch elements and haptic element only come into active connection after they have been fitted together. The drawback here however is that it is necessary to ensure a very close tolerance of the parts which support the switch element and haptic element, which are to be connected together, otherwise faulty positioning may have to be taken into account. DE 43 13 030 A1 and U.S. Pat. No. 5,805,402 describe groups of switches based on flexible printed conductors. They consist essentially of electrical switch elements which can preferably be used in vehicles having a flexible foil touch panel or separate operating elements held in a console. Even with this technical solution bringing together the electrical switch elements and the haptic element requires considerable effort and great care. Furthermore, switch blocks of this kind considerably restrict the freedom of design since the geometrical arrangement of the individual switch elements determines the positioning of the operating elements of the haptic element. With many design specifications, such as are customary in the automotive industry, there is a great degree of variation in the foil-bound switch elements, unless one always proceeds from the variation having the highest design specification and does not connect up the corresponding switches where the design specifications are lower. However, this leads to an undesirably high use of resources.

SUMMARY OF THE INVENTION

The object of the invention is to provide a switch to be mounted on a design element in the passenger compartment of a motor vehicle, for example on the inner trim of a door, which is cost-effective to manufacture and which can be fitted simply and securely and which can be adapted to any desired design.

According to this, the zones of the flexible conductor which support the switch elements, and the zones or operating elements of the haptic element which are associated with these zones are designed so that the relevant zones can be positioned and fixed relative to each other and can be detached from each other. Furthermore, these zones have no means for establishing a permanent electrical circuit connection. Thus, no permanent electrical contact is produced between the zones on the two sides. The term "electrical" and "electronic" switch elements includes electro-magnetic and electro-optical switch elements.

According to a variation of the invention it is hereby proposed that the haptic element cannot be brought into an electrically conductive connection with the switch elements, i.e. the haptic element has no electrically conductive component parts which can be coupled electrically with the switch elements.

According to another variation of the invention the haptic element can only be brought into electrically conductive connection with the switch elements by actuating an operating element of the haptic element whereby the electrically conducting connection only exists for as long as the switch is located in the switching state produced by actuating the operating element ("switch closed"). With this variation of the invention, the haptic element has no electrical structural elements in the narrower sense (such as e.g. a resistance, a transistor, etc.), but only a contact bridge in the form of a simple electrical conductor with which an electrical connection can be established between two switch elements.

According to a preferred embodiment of the invention, the relevant zones of the conductor and haptic element are formed as mechanical plug connectors wherein a base member of the haptic element has a socket zone, such as e.g. a plug opening with which the zone of the flexible conductor supporting the switch elements can be brought into positive keyed engagement. To this end, the zones of the flexible conductor supporting the switch elements has a mechanical reinforcement element in the form of a frame around the edges, a plate at the back or a cast element incorporating the relevant zone.

A cast element is suitable when using contactless switch systems, such as magneto-resistive sensors or inductive and capacitive close-range approach sensors. The cast element thereby offers, in addition to good protection against mechanical damage, also excellent protection against chemical attack and obviously against dampness. This in turn guarantees that the switch has a high reliability and long service life.

Through suitably configuring the reinforcement element which is connected to the flexible conductor, and also the close-fitting corresponding socket opening in the haptic element, the plug connection can only be established in the proposed position. Forming the reinforcement element, whether it is by sticking a plate onto the reverse side of the conductor or by injection molding a frame round the edge of the conductor or by casting the end region of the conductor, can be undertaken with high precision and efficiency by automated machines.

The mechanical reinforcement elements can also have detent elements for securing the insert position with regard to the haptic element, as well as means for sealing the plug-in zone against dampness. When manufacturing such components it is possible to use twin component plastic injection molding technology so that it is easier to meet the demands required for a seal through the softer of the two plastics.

A further embodiment of the invention proposes designing the zones of the flexible conductor, supporting the switches, and the associated zone of the haptic element as a clamp-fit connection whereby a base body of the haptic element has a socket zone and a fixing element connectable therewith so that the zone of the flexible conductor supporting the switch elements can be clamped between the socket zone of the haptic element and the fixing element. This can be undertaken for example by a fixing element which is connected in one piece with the base body through a film hinge of a plastic base body of the haptic element. After the corresponding zone of the flexible conductor has been supplied to the socket zone of the base body, the fixing element can be swivelled towards the socket zone until its position is secured through detent elements and the conductor is thereby fixed with the switch elements relative to the position of the operating elements.

A further development of this embodiment proposes using a separate clamping plate as the fixing element. In this case the clamping plate should be provided with positive locking elements (e.g. studs) which are associated with matching detent openings (preferably around the edge) of the flexible conductor. These positive locking elements can be arranged so that only an exact positioning is possible between the clamping plate and conductor. The clamping plate is then fixed on the base body of the haptic element by means of a snap-fitting connection.

Basically all types of switch elements can be used if they are suitable for fitting flexible printed conductors. These can be formed, for example, as electrical contact faces which are allocated an electrical contact bridge which is connected to an operating element of the haptic element and closes the electric circuit when the operating element is actuated. Apart from the inductive and capacitive close-range approach switches and magneto-resistive structural elements (e.g. Hall element) already mentioned and which are each assigned a ferro-magnetic metal plate or a permanent magnet connected to an operating element of the haptic element, boxed switch elements are also suitable in the form of SMD (Surface-Mounting Device) switches or switch mats. Furthermore, transponder readers are also suitable as switch elements. Which type of switch is selected by the technician depends decisively on the technical requirements in each individual case.

At this point it should be pointed out that non-electrical principles can be used. By way of example, the switch elements provided on the flexible conductor can be formed as passive or active optical elements which are assigned on the side of the operating elements of the haptic element means for reflection for the purpose of establishing an optical transmission path or means for interrupting an optical transmission path. Further processing of the switch signal is undertaken through the interposition of an opto-electrical converter.

Next to the switch elements there are, where necessary, further structural elements such as for example an optical element for lighting up the switch, a micro controller, resistances, diodes or the like.

The invention utilizes the principle of the plug connection in order to establish in a simple reliable way an active connection between the switch elements and the operating elements of the haptic element without using at the same time (permanent-acting) electrical cable connections which are liable to breakdown. The configuration of the zones of the flexible conductor supporting the switch elements is entirely secondary to the configuration of the haptic element while simultaneously reducing the variety of designs on the switch side. i.e., by means of the technical solution according to the invention (theoretically) any number of geometric arrangements of the operating elements of the haptic element can be fitted with only one variation of cable harness.

BRIEF DESCRIPTION OF THE DRAWINGS

The invention will now be explained in further detail with reference to the embodiments shown in the drawings in which.

DETAILED DESCRIPTION OF THE INVENTION

Mounting electrical and electronic structural elements 3*a,* 3*b,* 21, 22, 23, 24 on flexible conductor plates or conductors 2, 2*a,* 2*b,* 2*c* is carried out by automatic manufacturing equipment which can be adapted to the various different requirements of the component parts which are to be fitted. Thus, it can also be envisaged that plug zones 20 or clamping zones 20' can be formed in the same production line. The relevant zones are then immediately available for connecting to a suitably adapted haptic element.

Figure 1:
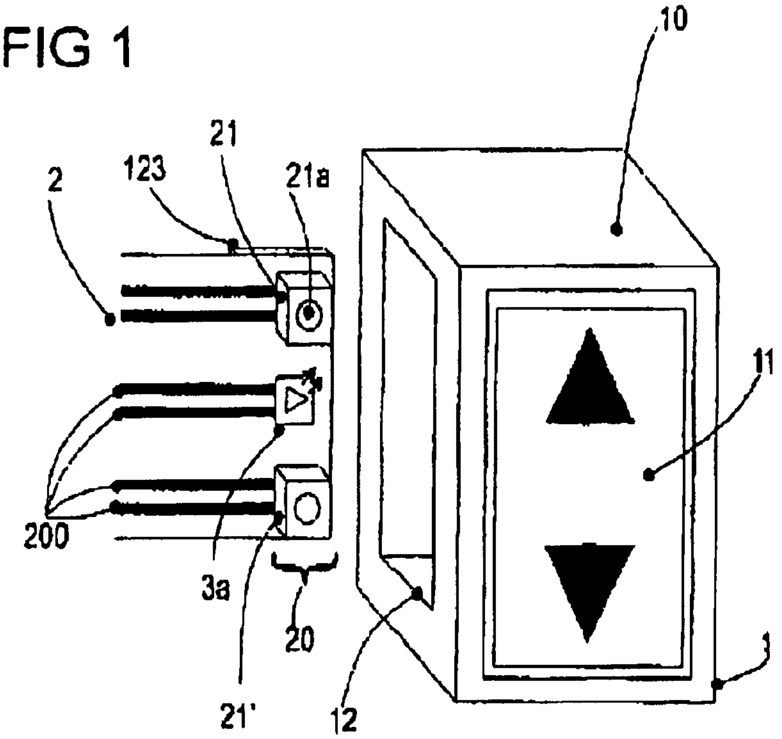
FIG. 1 shows a flexible conductor with a reinforcement element formed as a plate on the reverse side, boxed switch elements formed on the front side and a haptic element with operating elements prior to connection with the switch.

FIG. 1 shows a flexible conductor 2 having conducting paths 200 to which are connected two boxed switch elements 21 and 21' (constructed as buttons) and an optical element 3*a* (e.g. light diode) for illuminating the switch. On the back of the conductor 2 there is a reinforcement element 123 in the form of a plate which is attached to and stabilizes a plug zone 20 which supports the switch elements 21 and 21' and is associated with a socket zone 12 of a base body 10 of a haptic element 1. Detent and sealing elements can, analogous with FIG. 9, be connected to the reinforcement element 123 to ensure secure fixing of the plug zone 20 in the haptic element 1 as well as an effective seal against dampness.

After introducing the plug zone 20 into the socket zone 12 of the base body 10 of the haptic element 1, an active connection is established between the switch elements 21 and 21' and an operating element 11. If finger pressure is applied to one of the zones of the operating element 11 marked by the arrows ↑ or ↓ then this zone flips in the direction of the corresponding switch element 21 or 21' and thereby actuates a sensor element 21*a* which leads to a switch signal. Once the operating or finger pressure has ceased, the operating element 11 automatically returns to its starting position whereby the switch signal is interrupted.

Figure 2:
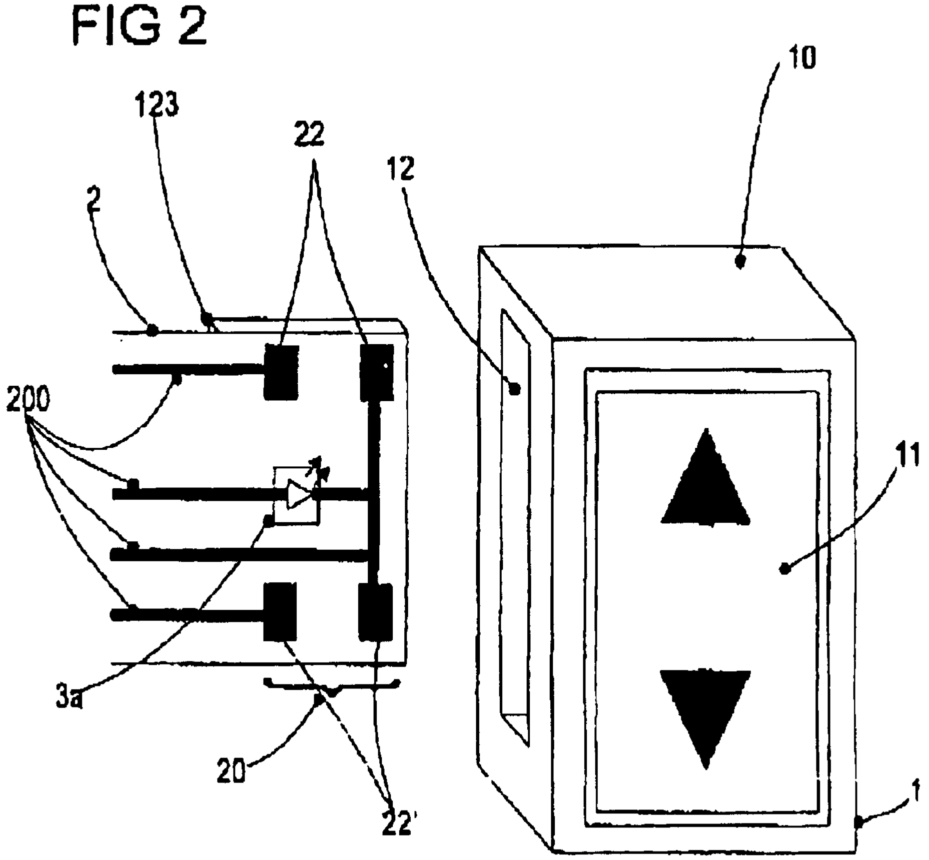
FIG. 2 shows the elements of FIG. 1, but with electrical contact faces as the switch element.

The embodiment of FIG. 2 corresponds substantially to that of FIG. 1. Only the switch elements 22, 22' are designed as electrical contact faces which are each assigned a contact bridge (not shown) from the inside of the operating element 11. A switch signal is thus produced by short-circuiting the adjoining and slightly spaced contact faces 22 and 22'. When using this embodiment in surroundings which are susceptible to dampness and possibly to particles of dirt, e.g. in the wet space of a vehicle door, a seal has to be provided around the edge of the socket area 12 of the haptic element 1. To accomplish this, not only are the means available as described above with reference to FIG. 1, but also there is the possibility of integrating a seal (e.g. through 2-component injection molding) in the base body 10 of the haptic element 1 since the switch elements which are formed as contact faces 22 and 22' do not really cause any extra thickness compared with the boxed switch elements 21 and 21' (see FIG. 1) which might hinder the insertion of the plug zone 20 into the base body 10.

Figure 3:
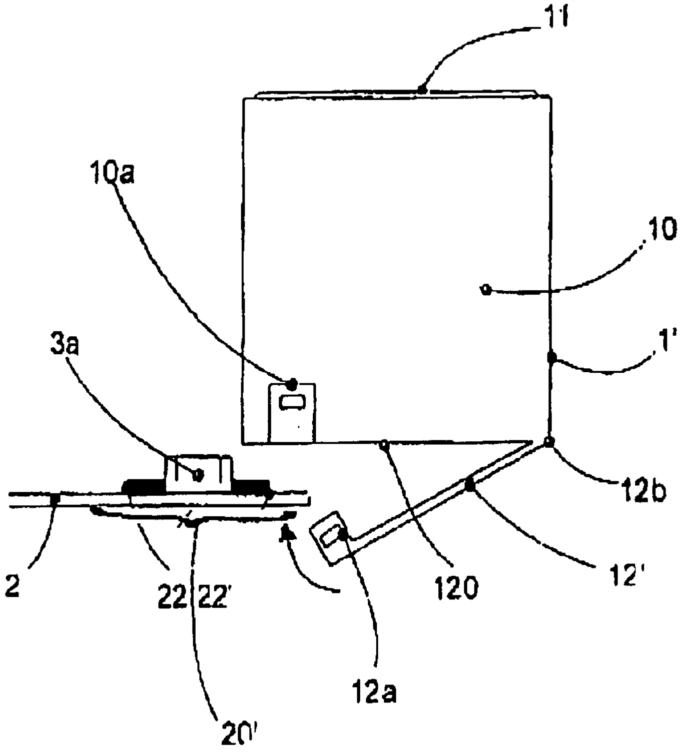
FIG. 3 shows a flexible conductor for clamp fitting on the base body of the haptic element by means of a clamping plate which is swivel mounted on the base body and can be locked therewith.

The variation of the invention, shown in FIG. 3 uses a clamping connection instead of a plug-in connection between the conductor 2 and a haptic element 1. According to this variation, a fixing element 12' designed as a clamping plate is attached to the base body 10 of the haptic element 1' through a film hinge 12*b* and after positioning a clamping zone 20' of the flexible conductor 2 relative to a socket zone 120 of the haptic element 1', the fixing element 12' can be fixed on the base body 10 through detent elements 10*a,* 12*a*. This produces a clamping fixing of the conductor 2 on the haptic element 1' The film hinge 12*b* could be used as a stop for correctly positioning the conductor 2.

Figure 4:
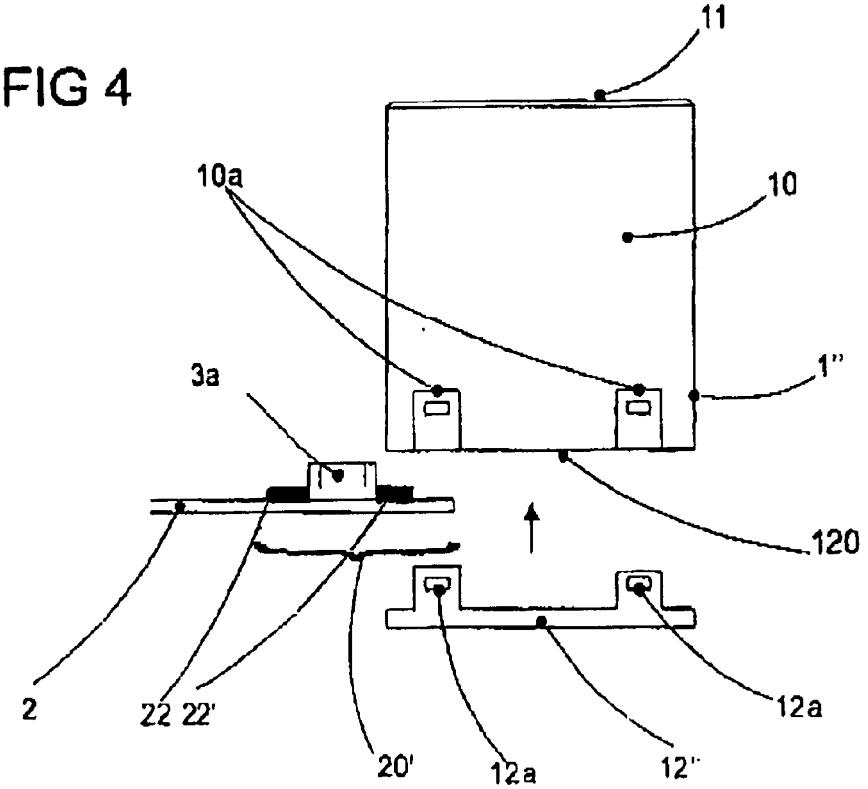
FIG. 4 is similar to FIG. 3, but with a separate clamping plate.
Figure 10:
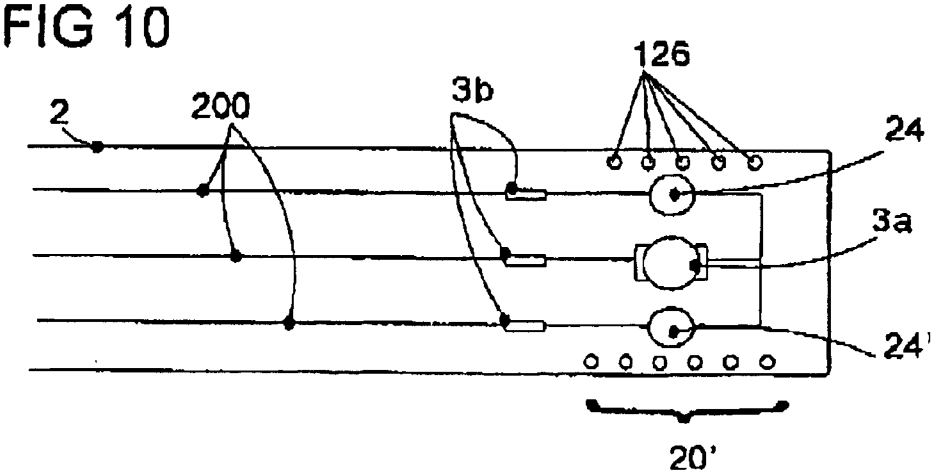
FIG. 10 shows a diagrammatic view of a flexible conductor with a clamping zone which has perforations for positioning the switch elements accurately relative to the haptic element.

As opposed to this, the switch in FIG. 4 uses a separate fixing element 12" which should preferably be provided with positive locking elements (not shown) which can engage in positioning openings of the flexible conductor 2 (analogous with FIG. 10). After clipping the fixing element 12" onto the base body 10 a permanently correct positioning of the switch elements 22 and 22' relative to the operating element 11 is guaranteed.

When using a clamping connection between the clamping zone 20' and the base body 10, a mechanical reinforcement element is no longer required.

Figure 5:
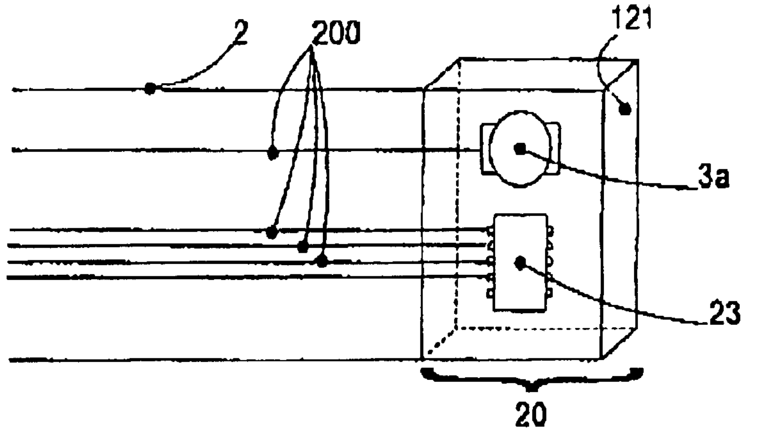
FIG. 5 shows a diagrammatic illustration of a flexible conductor with a close-range approach switch or the like wherein the plug area is formed by a cast element.

FIG. 5 shows a mechanical reinforcement element 121 in the form of a cast element (e.g. based on an epoxy resin or a plastic material which completely encases the plug zone 20 and in which an electronic contactlessly operating switch 23 (e.g. Hall element) is embedded which reacts in close range with an associated zone of the operating element 11 or a part connected thereto. Furthermore an optical element 3*a* is provided for illuminating the switch.

Figure 6:
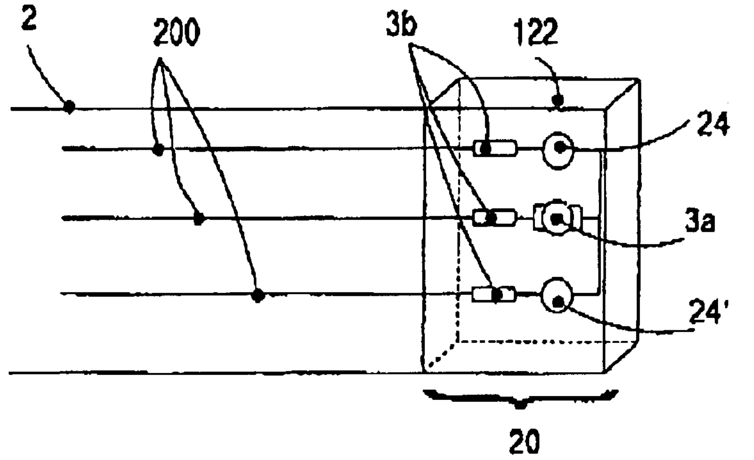
FIG. 6 shows a diagrammatic view of a flexible conductor with switch elements in the form of a boxed touch panel and a plug zone formed as a cast element wherein the cast element has recesses in the region of the touch panel.

In the embodiment of FIG. 6 recesses are provided in a cast reinforcement element 122 in the region of switch elements 24 and 24' formed as buttons (analogous with FIG. 1), to allow access and thus operation through the operating element 11. Depending on a user's specific requirements, further electronic structural elements 3*b* are included in the cast element 122. In order to reliably avoid a false execution of the plug fitting process, the contours of the mechanical reinforcement elements 121, 122, 123, 124, 125 and socket openings 12 of the base body 10 should be matched with each other along the lines of the key principle.

Figure 7:
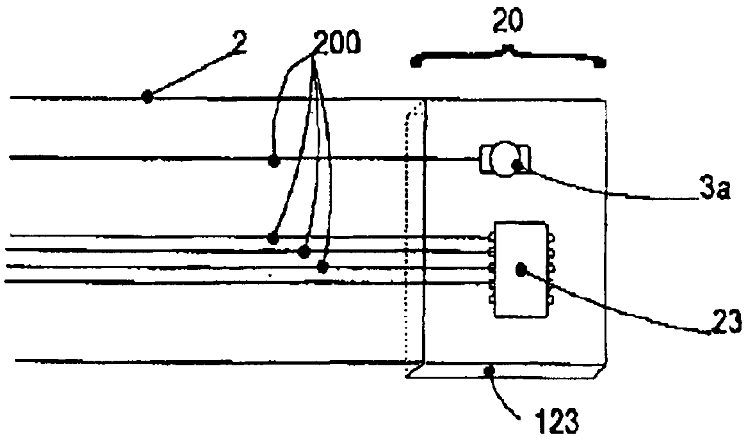
FIG. 7 shows a diagrammatic view of a flexible conductor with a reinforcement plate stuck onto the underneath to form the plug zone.

FIG. 7 corresponds substantially to a combination of the mechanical reinforcement element 123 of FIG. 1 and the fitting out of electronic structural elements according to FIG. 5.

Figure 8:
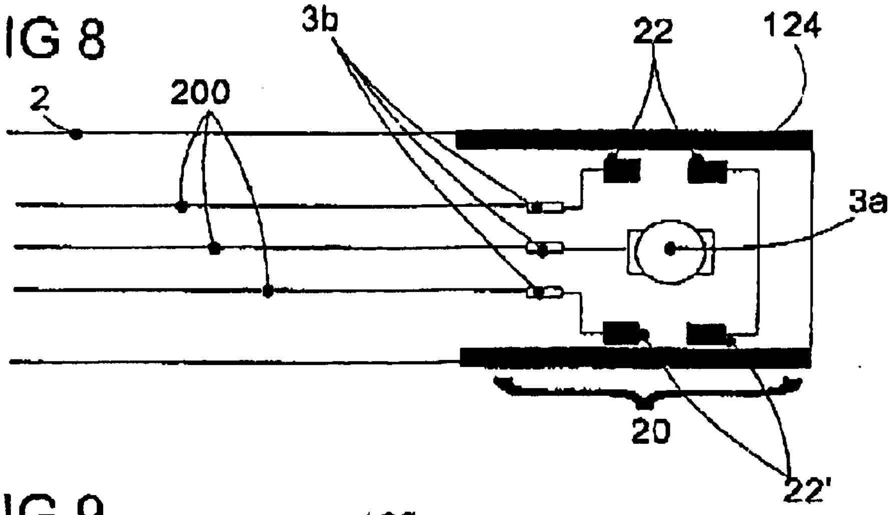
FIG. 8 shows a diagrammatic view of a flexible conductor with a plug zone formed by a frame around the edge.

FIG. 8 shows a mechanical reinforcement element in the form of a frame 124 which is connected to a side edge of the conductor 2, for example by injection molding or even by sticking.

Figure 9:
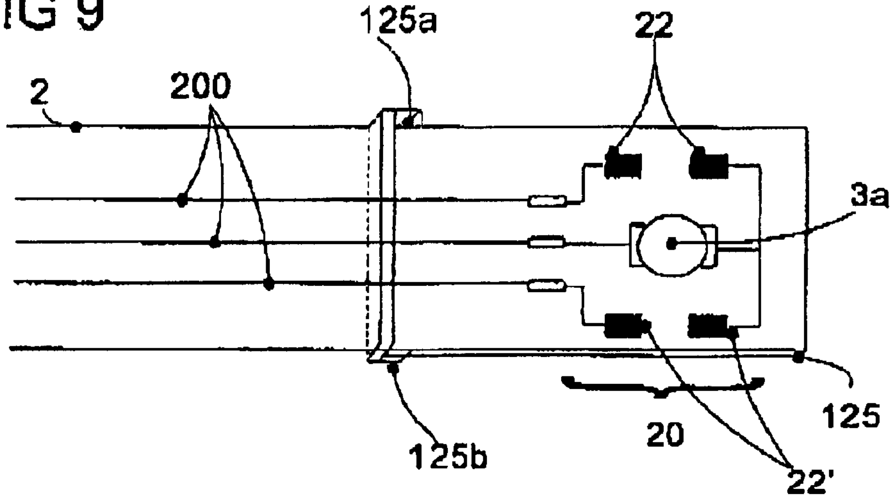
FIG. 9 shows a diagrammatic view of a flexible conductor with a plate molded onto the underneath and with a sealing element closing the plug zone, as well as with detent elements fixing the plug-in position in the haptic element.

The reinforcement element shown in FIG. 9 consists of a plate 125 connected to the underneath of the conductor 2 and provided on its inner edge with a molded seal 125*a* having detent elements 125*b*. In conjunction with a haptic element similar to FIG. 1 and adapted detent elements of the base body, it is possible to guarantee a permanent secure positioning of the switch elements 22 and 22' relative to the operating element 11. The seal 125*a* keeps out dirt particles and dampness from the electrical and electronic structural elements.

One example of a flexible conductor 2 for clamp fixing on a haptic element is shown in FIG. 10. According to this example, perforations 126 are formed in the clamping zone 20' of the conductor 2 and are associated with detent pins (not shown) on a fixing element 12". The different patterns of perforations 126 in the two edges guarantees accurate positioning of the conductor 2 relative to the fixing element 12" and thus also to the operating element 11.

Figure 11:
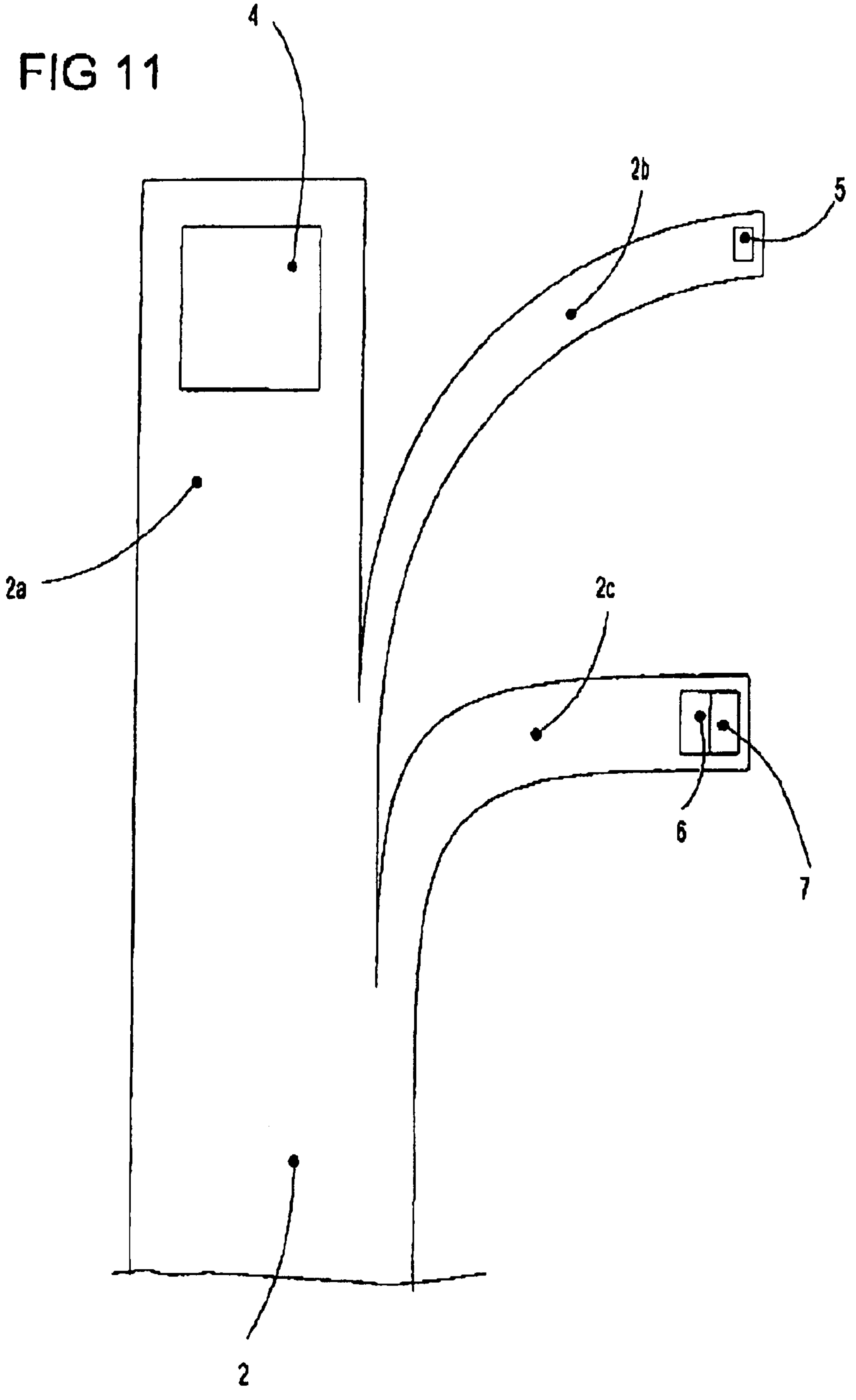
FIG. 11 shows a diagrammatic view of a flexible conductor which is divided up into three arms with plug zones at the ends for different functioning units.

The diagrammatic illustration of FIG. 11 shows a conductor 2 split up into three conductor arms 2*a,* 2*b,* 2*c*. End zones 4, 5, 6, and 7 are each assigned different functions. For a cable inserted in a vehicle door on the drive side, for example, the zone 4 could be connected to a switch module which is provided for operating the front and rear window lifters, the mirror and the child lock. Unlocking the petrol tank could be assigned to the zone 5 of the conductor arm 2*b*. Finally the zones 6 and 7 can be connected to indicator instruments showing the state of the door locks.

What is claimed is:

1. A switch to be mounted on a design element in the passenger room of a motor vehicle, comprising:

a haptic element having a base body comprising a socket zone, and at least one mechanical operating element movable relative to the base body; and a flexible conductor having a reinforced supporting zone with a plurality of electrically conductive switch elements mounted on the supporting zone of the flexible conductor, wherein the haptic element comprises an actuator connected to the operating element, wherein the actuator actuates at least one of the plurality of switch elements when the operating element is actuated, and wherein the supporting zone of the flexible conductor and the socket zone of the haptic element are configured so that they are positioned and fixed relative to each other without establishing a permanent electrical conductive connection between the flexible conductor and the haptic element, and wherein the socket zone of the haptic element receives the switch elements, and wherein when the socket zone receives the switch elements, the switch elements enter into an active connection with the actuator of the operating element so that a switch signal is triggered by the actuator acting on the switch elements during actuation of the operating element.

2. The switch according to claim 1 wherein the actuator is an electrical conductor.

3. The switch according to claim 1 wherein the actuator is an electrical bridge.

4. The switch according to claim 1 wherein the haptic element can only be brought into electrically conductive connection by the actuator with at least one of the switch elements by actuating the operating element of the haptic element.

5. The switch according to claim 4 wherein the electrically conductive connection exists when the operating element is activated and does not exist when the operating element is not activated.

6. The switch according to claim 1, wherein the haptic element has no electrical structural elements apart from the actuator, which is formed as an electrical conductor.

7. The switch according to claim 1, wherein the actuator of the haptic element has as a single electrically conductive component which can be coupled electrically with at least one of the switch elements which is a contact bridge with which an electrical connection can be established between two switch elements.

8. The switch according to claim 1, wherein the zones of the conductor and the haptic element are formed as mechanical plug connectors and wherein the base body of the haptic element includes the socket zone with which the zone of the flexible conductor for supporting the switch elements is brought into positive engagement.

9. The switch according to claim 8 wherein the zone of the flexible conductor for supporting the switch elements has a mechanical reinforcement element.

10. The switch according to claim 9 wherein the mechanical reinforcement element is formed as one of a frame around the edges of the conductor, a plate attached to a back surface of the conductor and a cast element attached in surrounding relation to the connector.

11. The switch according to claim 9 wherein the mechanical reinforcement element has at least one detent element for securing the insert position in respect of the haptic element and/or means for sealing the plug zone against damp.

12. The switch according to claim 1 wherein the zones of the conductor and haptic element are formed as clamp-fit connections wherein the base body of the haptic element includes the socket zone and a fixing element connectable therewith so that the zone of the flexible conductor for supporting the switch elements can be clamped between the socket of the haptic element and the fixing element.

13. The switch according to claim 12 wherein the fixing element is connected in one piece with the base body of the haptic element through a film hinge and wherein the fixing element and the base body are each composed of a plastic material.

14. The switch according to claim 12 wherein the fixing element and the base body of the haptic element are separate component parts and wherein the fixing element is formed as a clamping plate.

15. The switch according to claim 12 further comprising means for positioning the zone of the flexible conductor for supporting the switch elements relative to the base body of the haptic element.

16. The switch according to claim 15 wherein the means for positioning the zone of the conductor are formed on the conductor in the form of at least one recess and on the base body of the haptic element in the form of corresponding studs.

17. The switch according to claim 1 wherein the switch elements provided on the flexible conductor are formed as electrical contact faces which are allocated the actuator, formed as an electrical contact bridge which is connected to the operating element of the haptic element and which when the operating element is actuated closes an electrical circuit connected to at least one of the switch elements.

18. The switch according to claim 1 wherein the switch elements provided on the flexible conductor are provided in boxes, in the form of SMD switches or switch mats.

19. The switch according to claim 1 wherein the switch elements provided on the flexible conductor are designed as magneto-resistive structural elements which are each allocated a permanent magnet which is connected to an actuating element of the haptic element.

20. The switch according to claim 1 wherein the switch elements provided on the flexible conductor are formed as inductive or capacitive close range approach switches.

21. The switch according to claim 1, wherein the switch elements provided on the flexible conductor are formed as transponder readers.

22. The switch according to claim 1 wherein the switch elements provided on the flexible conductor are formed as passive or active optical elements allocated the actuator on the operating element of the haptic element formed as means for reflection for the purpose of establishing a visual transmission path or means for interrupting a visual transmission path.

23. The switch according to claim 1 further comprising an optical element for illuminating the switch, a micro controller, resistances, and diodes mounted on the zone of the flexible conductor for supporting the switch elements.

24. The switch according to claim 1 wherein the zone of the conductor for supporting the switch elements is detachably connected to the haptic element.

25. The switch according to claim 1 wherein the switch has, in addition to the switch elements, further electrical and/or electronic structural elements.

26. The switch according to claim 1 wherein the zone of the haptic element associated with the switch elements forms at least one operating element of the haptic element.

27. A switch to be mounted on a design element in the passenger room of a motor vehicle, comprising:

a haptic element having a base body comprising a socket zone, and at least one mechanical operating element movable within the socket zone, wherein an electrically conductive actuator is attached to the at least one mechanical operating element;

a flexible conductor having a reinforced supporting zone; and a plurality of electrically conductive switch elements mounted on the supporting zone of the flexible conductor;

wherein the socket zone of the haptic element receives the supporting zone of the flexible conductor, such that the socket zone and the supporting zone are fixed relative to each other without establishing a permanent electrical conductive connection between the flexible conductor and the haptic element;

wherein a movement of the at least one mechanical operating element into the socket zone causes the electrically conductive actuator to contact and electrically activate at least one of the plurality of electrically conductive switch elements.

* * * * *

UNITED STATES PATENT AND TRADEMARK OFFICE

CERTIFICATE OF CORRECTION

PATENT NO. : 6,765,159 B1 
DATED : July 20, 2004
INVENTOR(S) : Uebelein et al.

It is certified that error appears in the above-identified patent and that said Letters Patent is hereby corrected as shown below:

Title page,
Item [73], Assignee, delete "Brose Fahrzeugteile GmbH & Co., Coburg (DE)",
insert "Brose Fahrzeugteile Gmbh & Co., KG, Coburg, Coburg (DE) --
Item [57], ABSTRACT,
Line 2, delete "room of a motor vehicle" insert -- compartment of a motor vehicle --
Line 3, delete "operater" insert -- operator --

Column 6,
Line 48, delete "room" insert -- compartment --

Column 8,
Line 43, delete "room" insert -- compartment --

Signed and Sealed this

Seventh Day of June, 2005

JON W. DUDAS
*Director of the United States Patent and Trademark Office*